United States Patent [19]

Riederer

[11] Patent Number: 4,830,012

[45] Date of Patent: May 16, 1989

[54] HIGH SPEED NMR IMAGING METHOD AND APPARATUS

[75] Inventor: Stephen J. Riederer, Durham, N.C.

[73] Assignee: Duke University, Durham, N.C.

[21] Appl. No.: 85,545

[22] Filed: Aug. 14, 1987

[51] Int. Cl.[4] .............................................. A61B 5/05
[52] U.S. Cl. .................................. 128/653; 324/309;
  324/312; 364/518; 364/413.3
[58] Field of Search ............... 128/653; 324/309, 312;
  364/415, 518

[56] References Cited

U.S. PATENT DOCUMENTS

| | | | |
|---|---|---|---|
| 4,651,095 | 8/1984 | Eastwood et al. | 324/312 |
| 4,702,257 | 10/1987 | Moriyama et al. | 128/653 |
| 4,710,716 | 12/1987 | Keren et al. | 128/653 |
| 4,721,912 | 1/1988 | Kaufman et al. | 324/309 |

Primary Examiner—Ruth S. Smith
Attorney, Agent, or Firm—Richard E. Jenkins

[57] ABSTRACT

Near real time imaging of materials within a body is accomplished by subjecting a body area to a predetermined plurality of applications of short repetition time NMR pulse sequences and constructing an image from data corresponding thereto. The image is continuously updated by collecting data from repetitive applications of one or more short repetition time NMR pulse sequences subsequent to the plurality of applications wherein each of the applications of one or more pulse sequences consists of fewer applications than the plurality of applications of pulse sequences. The imaging data from each of the applications of one or more pulse sequences is repetitively substituted for corresponding imaging data previously used to construct the image in order to provide for continuous partial updating of the image. A processing method and apparatus is also disclosed which operates in near real time and permits an operator to interactively control the angulation of an image slice by altering selectable gradient parameters.

26 Claims, 8 Drawing Sheets

HIGH SPEED NMR IMAGING METHOD AND APPARATUS

TECHNICAL FIELD

This invention relates generally to an apparatus and a method for producing images of the interior of a body using data derived from NMR measurement techniques, and more particularly to an improved apparatus and method for near realtime imaging with operator interactive control of image parameters.

BACKGROUND ART

Nuclear magnetic resonance (NMR) has seen increasing acceptance in recent years as a diagnostic tool for producing images of the interior portions of the human body. NMR diagnostic medical imaging is particularly attractive since it does not subject a patient to the potentially hazardous x-rays utilized in most prior art imaging technology. However, a disadvantage of NMR diagnostic use is the relatively long scan time required in order to form certain images. Presently, the scan time can be on the order of about five minutes or more for many human imaging applications, and this lengthy scan time serves to limit the clinical usefulness of NMR imaging in certain applications.

One of the major impediments to high speed magnetic resonance imaging is the long time required for data acquisition and reconstruction. To date no method is known which can image in "realtime". That is to say, a method has not as yet been devised in which NMR signals are acquired and used to immediately generate a reconstruction and provide an image within about 100 milliseconds or less.

The deficiency of the prior art is the belief that all spectral components of an image must be acquired before the image can be reconstructed. The novelty of the present invention is the recognition that immediately after each spectral component or signal is acquired, it is used to update the NMR image being displayed on a video monitor or the like within about 50–100 milliseconds. Moreover, the method and apparatus of the present invention provide for instantaneous interactive operator control of image parameters so as to allow, for example, for selective adjustment of the angulation or obliqueness of an image slice.

DISCLOSURE OF THE INVENTION

In accordance with the present invention, applicant provides a method and apparatus for use in diagnostic NMR imaging which is capable of continuous near realtime imaging and further provides for operator interactive control of certain image parameters.

Briefly, the method of forming near realtime computed images of materials within a body based on measurements of NMR characteristics comprises the steps of subjecting a selected body area to a predetermined plurality of applications of a short repetition time NMR pulse sequence, wherein each application corresponds to one of a corresponding plurality of phase encodings, and collecting data from which an image can be formed. An image is constructed from the imaging data corresponding to the predetermined plurality of applications of the NMR pulse sequence, and the image is continuously updated by collecting imaging data from repetitive applications of one or more short repetition time NMR pulse sequences applied after the predetermined plurality of applications of NMR pulse sequences, wherein each of the applications of one or more pulse sequences consists of potentially fewer applications than the predetermined plurality of applications of the NMR pulse sequence, and then repetitively substituting the imaging data from each of the applications of one or more pulse sequences for corresponding imaging data previously used to construct the image.

Applicant also provides for concurrently and interactively adjusting the image being constructed by altering selectable gradient parameters including slice selection, phase encoding and frequency encoding. The interactive adjustment by an operator would typically include the angulation or obliqueness of a slice.

In another aspect, the invention comprises a high speed imaging apparaturs such as a video processor for constructing and displaying realtime images of a body portion of interest which are derived from NMR measurements and includes means for performing NMR measurements on a body using a predetermined pulse sequence and means for subjecting the signals derived from the pulse sequences to a Fast Fourier Transform and then storing the signals in buffer memory means with the most recently acquired signals at the top of the memory means. Means are provided for providing a video synchronization pulse at predetermined intervals, and means are provided for reading a predetermined one or more of the most recently acquired signals and the previous one or more signals corresponding thereto in the image being displayed from the buffer memory means upon prompting by the video synchronization pulse. The video processor further includes means for processing the signals read from the buffer memory means including means for determining the difference between the one or more recently acquired signals and the previous one or more signals corresponding thereto, means for determining the contribution to the image from said difference between corresponding signals, means for adding said image contributions to the existing total current image contained in an image storage memory means, and means for forming and displaying a continuously updated image of the body portion of interest. The applicant contemplates that the processor may include means for interactive control of the image being constructed and displayed in order to obtain a desired oblique angulation of the image.

Therefore, it is an object of the present invention to provide an method for realtime NMR imaging of a body portion.

A further object of the present invention is to provide an NMR method for realtime imaging of a body portion which includes operator interactive control of image parameters so as to allow for adjustment of the angulation or obliqueness of the image slice.

Yet another object of the present invention is to provide an apparatus for continuous near realtime NMR imaging of a body portion of interest.

Still another object of the present invention is to provide an apparatus for continuous near realtime NMR imaging of a body portion which further includes operator interactive control of selected image parameters in order to provide for adjustment in the angulation or obliqueness of the image slice.

BRIEF DESCRIPTION OF THE DRAWINGS

Some of the objects of the invention having been stated, other objects will become evident as the description proceeds, when taken in connection with the accompanying drawings, in which.

BEST MODE FOR CARRYING OUT THE INVENTION

There are several new individual concepts of magnetic resonance imaging (MRI) proposed by applicant which when combined provide the basis for the present invention of continuous near realtime 30 image/second MR imaging with operator interactive control of image parameters. Before discussing these concepts, applicant will first define certain key terms. By "continuous" it is meant that the method is capable of operating for arbitrarily long durations. That is, there are no constraints such as digital frame memory size which would restrict the NMR imaging procedure to some finite time. By near "realtime" it is meant that the NMR image displayed on a video monitor or the like is reconstructed within a very short time after NMR signal acquisition has occurred. This "short time" is subject to definition, but for the purposes of the present invention means within one to several video frame intervals, where an individual frame interval is 1/30 second. Thus 30 images/second is the rate at which individual distinct images are presented to the viewer of a video monitor. Although applicant has described instrumentation which operates at 30 $H_z$, it is clearly contemplated that the image rate could be as little as 5 $H_z$ and still fall within the scope of the invention. "Operator-interactive control" means that the operator has the ability to adjust some feature of the image, with the NMR image acquisition being modified accordingly within approximately one second, and corresponding NMR images to be subsequently acquired, reconstructed, and displayed in realtime. Among the image features which could be adjustable in this fashion are the angulation or obliqueness of a slice, slice thickness, slice position, field of view, and whether or not subtraction is to be performed for applications such as angiography. The angulation is, however, the primary adjustment contemplated by applicant's invention.

Figure 1A:
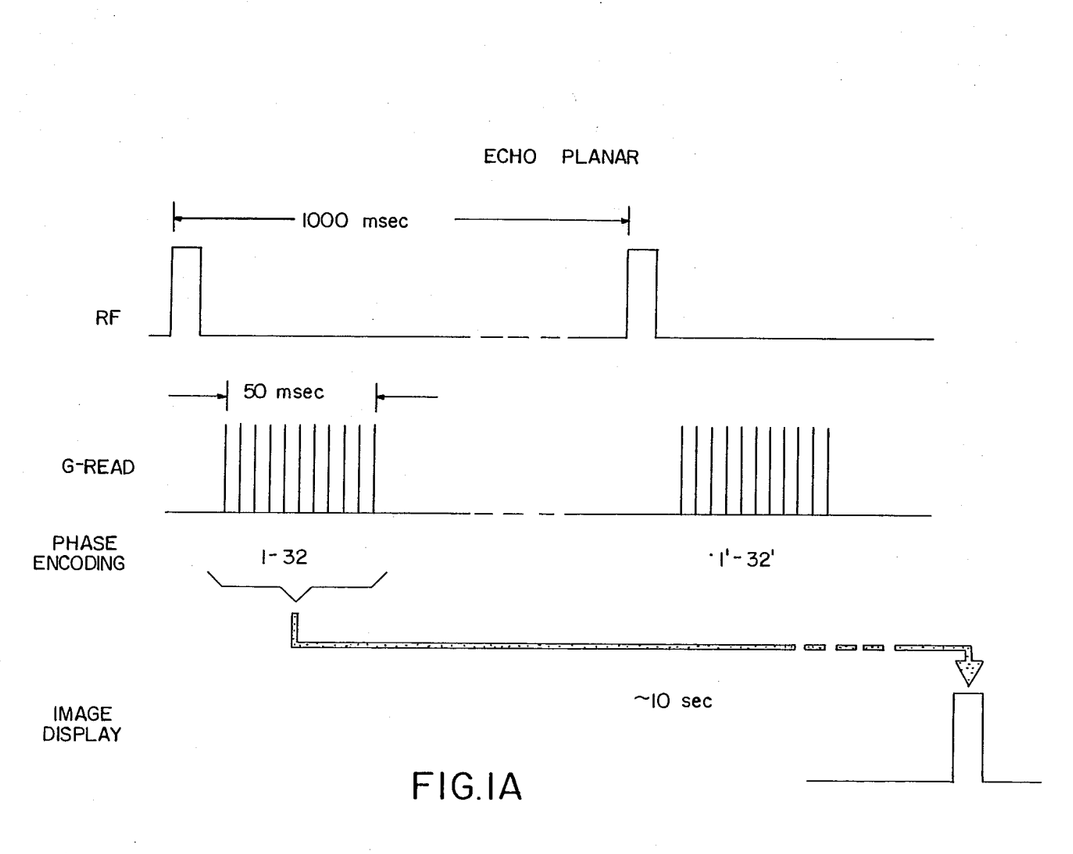
FIG. 1A is a timing schematic for echo-planar imaging.

As background for a full understanding and appreciation of the instant invention, applicant will compare the new method with two generic high speed methods for NMR image acquisition previously known. These are Echo-Planar Imaging (proposed by Mansfield) and Limited Flip Angle or FLASH imaging (proposed by Frahm). Both of these methods are conventional and known to those skilled in the art. Timing schematics of all three techniques are shown in FIGS. 1A-C.

With echo-planar imaging (FIG. 1A) one RF pulse is used to nutate some or all of the magnetization into the transverse plane. Upon completion of the RF pulse the gradient waveforms are pulsed so that the measured signal effectively samples a portion of the spatial two-dimensional Fourier transform of the final image. In this figure only one gradient (G-READ) is shown but in practice two are generally used. The term "PHASE ENCODING" refers to which specific strips of Fourier space are sampled by the signal. In the diagram shown, 32 strips are sampled one after the other. In practice more or fewer than 32 are possible. Acquisition time for one image is about 50 milliseconds. Upon completion of the acquisition, the detected NMR signals for all strips are then passed to a computer for image reconstruction. This is performed via two-dimensional inverse Fourier transformation and the final image is available for display some time (e.g., 10 seconds) later. Additionally after the 32 strips are measured it is necessary to allow for recovery of the longitudinal magnetization to occur before the next image can be measured. This typically requires 1000 milliseconds at which time the acquisition may be repeated. At this point the same 32 strips may be sampled as before, as shown, but the primes (1'-32') are used to indicate a different time at which the measurements are done. With this approach, the image acquisition rate is about 1-2 per second.

Figure 1B:
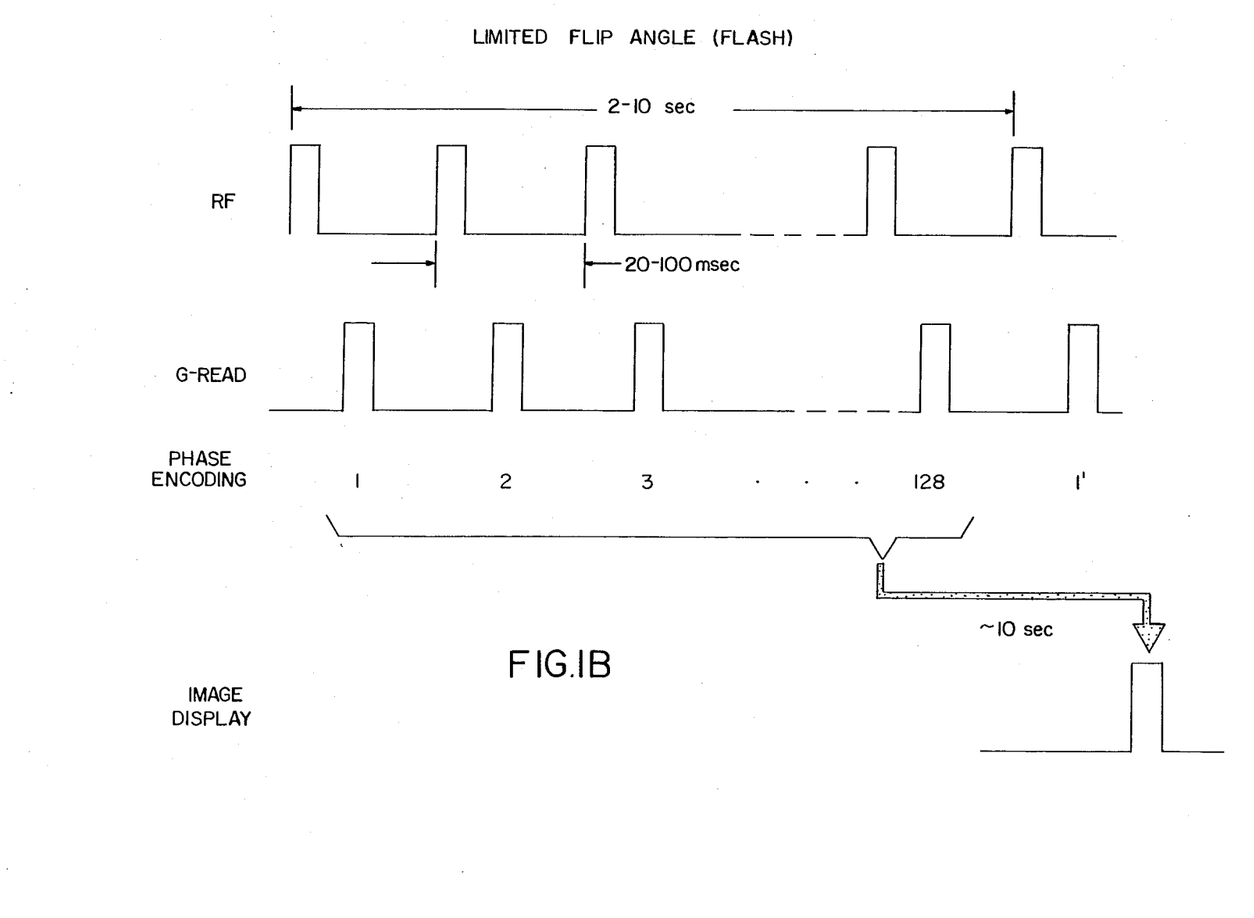
FIG. 1B is a timing schematic of limited flip angle (FLASH) imaging.

A second high speed technique "FLASH" is shown in FIG. 1B. In this case an RF pulse is applied at a repetition interval or TR time of 20 to 100 milliseconds and only one gradient G-READ pulse is applied per RF pulse. The number of strips or phase encodings acquired is typically larger, with 128 a common value. This yields an acquisition time of about 2 seconds or more. Again, only after all phase encodings have been acquired is the reconstruction performed via computer with the image displayed some 5 to 10 seconds later. Image acquisition rate is about 0.5 seconds or less.

Figure 1C:
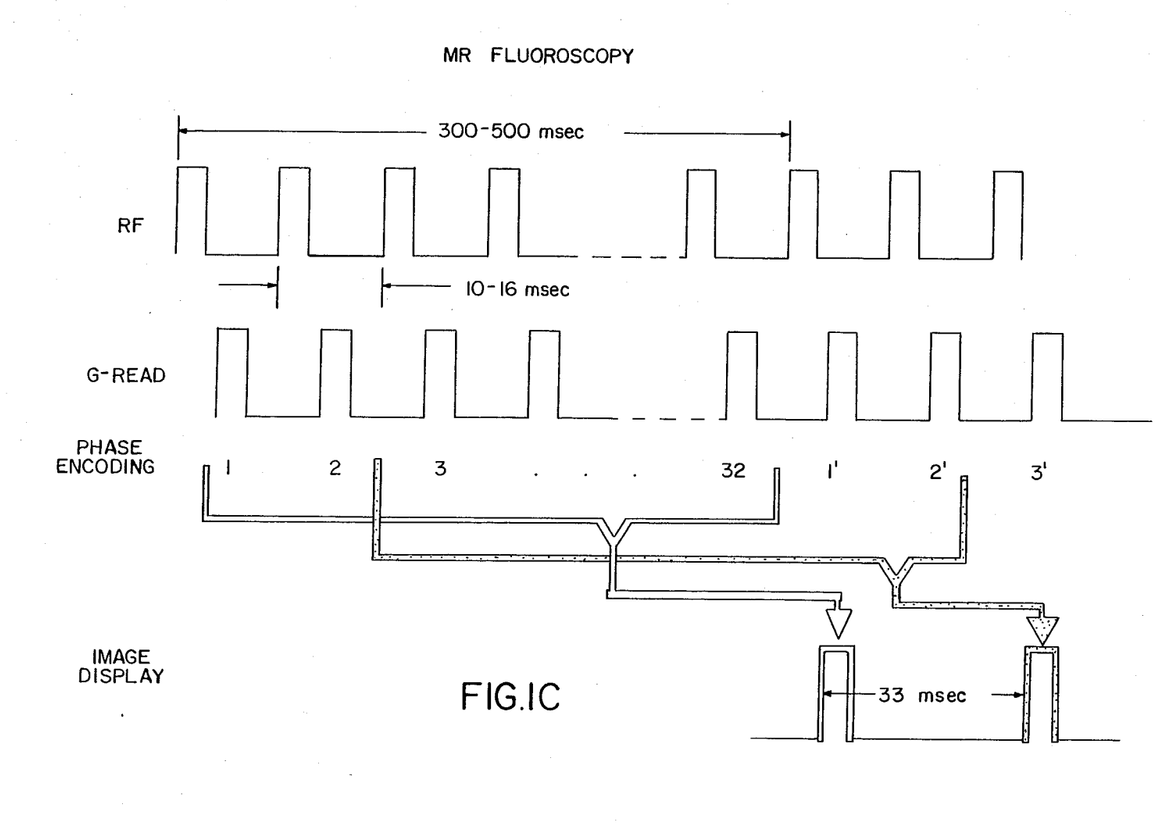
FIG. 1C is a timing schematic of the imaging method of the present invention.

Finally, the invention proposed by applicant is shown in FIG. 1C. The sequence of RF and gradient pulses is similar to the FLASH technique of FIG. 1B except that the TR time is reduced to about 10 milliseconds. The distinction between applicant's method and FLASH lies primarily in the reconstruction. Several specific differences can be easily pointed out. First, as can be seen from FIG. 1C, the second image of the image sequence need not be formed from data which is completely distinct from that used for the first image. For example, the first pulse of the Image Display line of FIG. 1C corresponds to an image reconstructed from phase encodings 1 through 32. The second pulse corresponds to presentation to the observer of the second image of the sequence. Note in FIG. 1C that the sequence of 32 phase encodings is applied repetitively. This means that the corresponding 32 strips in Fourier space are sampled repetitively. Further observe in the figure that the second displayed image is also formed from 32 phase encodings but that the most recently acquired encodings 1' and 2' are used rather than the initially acquired encodings 1 and 2. Again, the primes simply indicate a different measurement time. The novelty of this approach is that a "window" which is 32 repetitions wide can be shifted and images can be generated at arbitrary positions of this window. Specifically, the window need not be displaced a distance equal to or exceeding its width (i.e., 32 phase encodings) before generation of the second image in sequence. In the example in FIG. 1C the window is shifted two repetition intervals between successive images of the image sequence. One novel feature of the invention is this "sliding window" for image reconstruction.

In the timing diagram of the NMR technique in FIG. 1C 32 phase encodings are assumed to be applied sequentially. It should be understood that the number 32 is intended to be an example. In general if this number were increased then one would have superior spatial resolution in the phase encoded direction because a greater number of spatial frequencies would be sampled. On the other hand, the acquisition time for one image would increase proportionately and the temperal resolution would subsequently be degraded. Thus, the exact number of encodings to use represents a tradeoff between spatial and temporal resolution and might well vary from one clinical application to another.

It is also conceivable that some phase encodings should be sampled more frequently than others. In particular low spatial frequencies might be more important since they carry information about gross object position. Finally, it may be desirable to measure more than one phase encoding per Radiofrequency (RF) pulse. This can be done by applying additional pulses to the gradients, as for the echo-planar method of FIG. 1A.

A second aspect of the reconstruction that distinguishes applicant's invention from FLASH is that each individual signal can be reconstructed separately. Although not shown explicitly in FIGS. 1A-1C, an NMR signal is measured during the duration of each pulse of the G-READ gradient. In both FIGS. 1A and 1B reconstruction commences only after all desired phase encodings have been measured. The reason for this is convenience. A two-dimensional Fast Fourier Transform (FFT) can be used to reconstruct the final image from the complete set of acquired data. On the other hand, because the data in NMR image acquisition is fundamentally acquired sequentially, it is conceivable that the reconstruction can be made more efficient by reconstructing each phase encoding individually immediately after measurement rather than waiting for all encodings to be acquired as has been the practice up to this time. This is particularly appropriate for the NMR imaging sequence of applicant's FIG. 1C. The second displayed image can be generated by simply determining the individual "reconstructions" of the second applications of phase encodings 1 and 2 and adding these to the first reconstructed image. At the same time the reconstructions of the initial applications of phase encodings 1 and 2 should be subtracted. As a consequence, the second image of the sequence can be generated by individually "reconstructing" four phase encodings and adding them to an existing image rather than using the existing standard technique of a reconstruction of all 32 encodings. Therefore, a second novel concept of applicant's imaging method is the reconstruction of each phase encoding individually.

Figure 2:
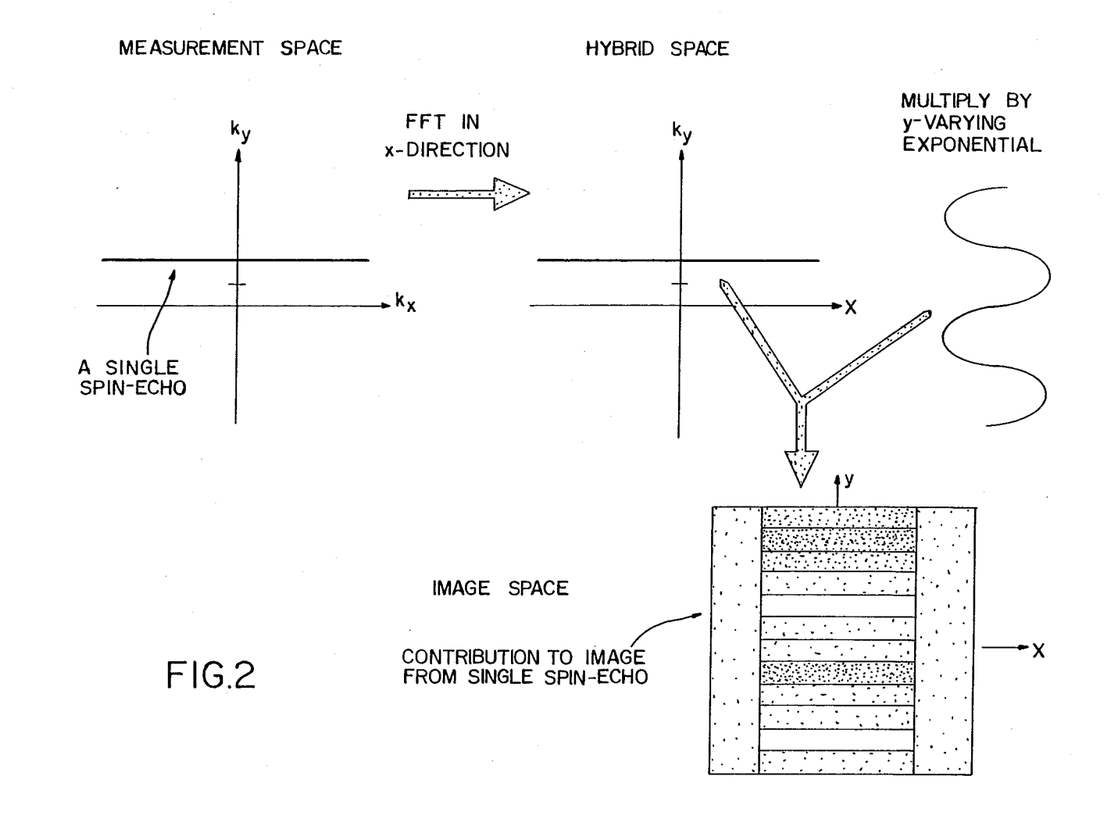
FIG. 2 is a schematic representation of how a single NMR measurement corresponding to one phase encoding is reconstructed.

Another novel concept of the reconstruction is that the reconstruction of an individual encoding can be performed at high speed such that near "realtime" NMR imaging is allowed. This can best be explained by referring to FIGS. 2 and 3. FIG. 2 illustrates how a single NMR measurement ("spin-echo") corresponding to one phase encoding is reconstructed. The measurement itself corresponds to a sample across a strip of Fourier space as shown. The displacement of the strip in the vertical direction away from the $k_x$ axis is dictated by the temporal integral of the phase encoding gradient. The single NMR measurement is reconstructed by first taking the Fourier transform of the measured spin-echo in the x-direction. The result is effectively a sample along a strip in the Hybrid Space depicted in FIG. 2. The reconstruction is completed by Fourier transformation along the y direction. However, this process is greatly facilitated because only one strip of the Hybrid Space contains values that are non-zero. As a consequence, the transform in the y direction reverts to the multiplication of each sample along the strip by a complex exponential varying along the y-direction. The complex exponential can effectively be considered a sinusoid-like function and is shown schematically in FIG. 2 as consisting of two cycles. The number of oscillations of the sinusoid is determined by the specific value of the phase encoding. The product of these two functions (the x-varying Fourier transform of the measured signal and the y-varying sinusoid) yields the reconstruction of the original individual spin-echo, and it is shown schematically in FIG. 2 as having white and black horizontal bands. In a rigorous sense this image can vary along the x-direction in an arbitrary fashion and in the y-direction in a sinusoidal manner. Referring back to FIG. 1C, such an image contribution would be generated for the newly acquired phase encoding 1' and similarly for phase encoding 2' and the resultant contributions then added to the first image on the display to provide the second displayed image. At the same time the contributions of the original application of encodings 1 and 2 would be subtracted as discussed earlier.

This process of reconstruction of individual phase encodings can be done at high speed, and this constitutes another novel feature of the invention. Moreover, this speed can be such that the image on a video monitor is updated every 1/30 second so as to be compatible with standard video rates. Generally, applicant contemplated that the image can be updated at intervals of between 10 and 500 milliseconds.

Applicant's invention therefore basically comprises steps of subjecting a selected body area to a predetermined plurality of applications of a short repetition time NMR pulse sequence, wherein each applications to one of a corresponding plurality of phase encodings, and collecting data from which an image can be formed. An image is constructed from the imaging data corresponding to the predetermined plurality of applications of the NMR pulse sequence, and the image is continuously updated by collecting imaging data from repetitive applications of one or more short repetition time NMR pulse sequences applied after the predetermined plurality of applications of NMR pulse sequences, wherein each of the application of one or more pulse sequences consists of potentially fewer applications than the predetermined plurality of applications of the NMR pulse sequence, and then repetitively substituting the imaging data from each of the applications of one or more pulse sequences for corresponding imaging data previously used to construct the image. The NMR pulse sequences are typically applied at intervals of about 8-20 milliseconds. The predetermined plurality of application of the NMR pulse sequence typically comprise 16-128 pulses having $16 \propto 128$ corresponding phase encodings. The application of one or more short repetition time NWR pulse sequences typically comprise 1-10 pulses having 1-10 corresponding phase encodings.

Figure 3:
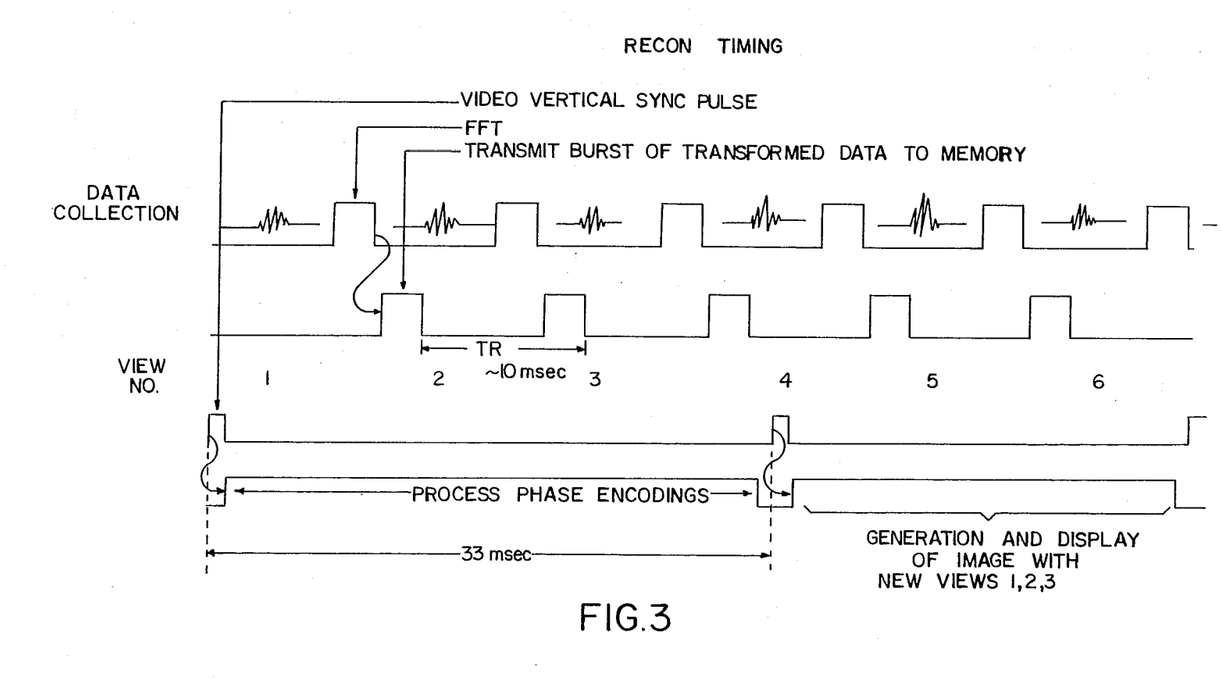
FIG. 3 is a timing schematic illustrating the measurement versus time of individual spin-echo NMR measurements for phase encodings 1, 2, 3, et al. according to the present invention.
Figure 4:
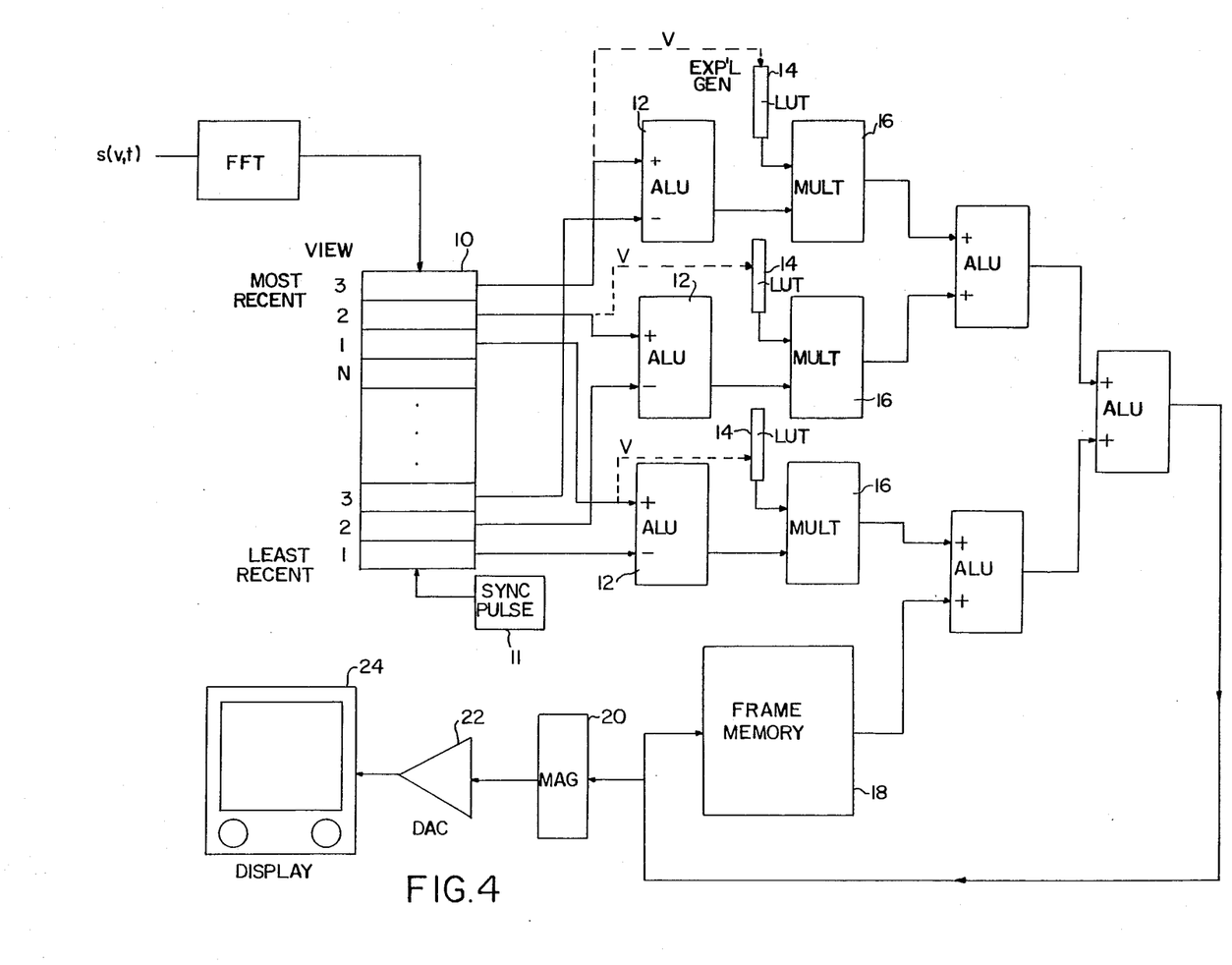
FIG. 4 is a schematic diagram of an apparatus for performing the method of the present invention.

One possible embodiment of the invention is shown in the timing diagram of FIG. 3 and schematic of FIG. 4.

FIG. 3 shows over time the measurement of individual spin-echo NMR measurements for phase encodings 1, 2, 3, etc. The duration of each measurement is approximately 5 milliseconds and it occurs during the application of the G-READ gradient of FIG. 1C. Immediately after a spin-echo is measured it is subjected to a Fast Fourier Transform (FFT) along the x-direction. This step was previously discussed in FIG. 2. The time required for this step is typically 5 milliseconds or less for a 256-point one-dimensional FFT using commercially available devices. Transformation of each measured signal occurs during the raised pulse following it. Also shown in FIG. 3 is a video vertical synchronization pulse that occurs with a period of 33 milliseconds. At the rising edge of this pulse all measurements made during the preceding 33 milliseconds and whose Fourier transforms have been completed are next subjected to the next step of the reconstruction, the multiplication by y-varying sinusoids discussed with respect to FIG. 2. During the subsequent video frame interval the image contributions from the recently acquired measurements are generated and added to the existing fully reconstructed image.

This can be further explained by referring to the schematic of FIG. 4. The digitized spin-echo signal s(v, t) is input at the upper left, subjected to the FFT and stored in buffer memory 10 with the most recently acquired signals at the top of the memory. Those skilled in the art will recognize the buffer memory 10 as a first-in first-out (FIFO) device which allows for the data acquisition rate and data processing rate to be unequal. The variable "t" represents time over the course of the 5 milliseconds long spin-echo while "v" represents the phase encoding value for that signal. The values of v are also stored with the FFT of the signal in buffer memory 10. When the rising edge of the vertical synchronization pulse occurs from the means 11 for repetitively providing the video synchronization pulse the recently acquired signals are read from buffer memory 10 along with the previous application of the same encodings. In the timing diagram of FIG. 3 encodings 1, 2, and 3 were acquired. Accordingly, the signals for these encodings are read from buffer memory 10 as well as the measurements for the same encodings measured during the preceding iteration. These are passed to an arithmetic logic units (ALU) 12 where their difference is formed. Referring to FIG. 1, this step ensures in forming the second displayed image that the newly acquired phase encoding 1' is added and the previously measured encoding 1 is subtracted. In the embodiment of FIG. 4 three separate ALU channels 12 are shown, one for each signal measured within a 33 millisecond video frame interval.

At the same time as the FFT signals are passed to ALU channels 12 the phase encoding value v is passed to a lookup table (LUT) 14 in which values of the complex exponential are stored. The exponential function for a specific value of v is passed to the same ALU channel to which the FFT signal was directed corresponding to the same v value. This is done for each of ALU channels 12.

After each ALU channel 12 is a multiplier 16. This device forms the product of the x-varying signal and y-varying exponential. This circuitry is replicated for each ALU channel 12 so that the image contributions for phase encodings 1, 2, and 3 are all reconstructed in parallel. Additionally, this circuitry is designed to operate at high speed (10 MHz), compatible with realtime digital video processing.

After multipliers 16 the outputs of all three ALU channels 12 are added together and also added to the current image which is contained in frame memory 18. The result is the image which has been updated by the most recently acquired measurements for phase encodings 1, 2, and 3, as desired. This updated image is then redirected back to frame memory 18 for storage and also to magnitude transformer 20, digital to analog converter 22, and to video monitor 24 for display.

The novelty of this concept is that the spin-echo measurements are used to update the displayed image on video monitor 24 virtually instantaneously (within less than two video frame intervals). Additionally, the process can occur continuously and indefinitely with no constraints on storage memory since storage memory is not required to store transformed signals for multiple images.

The invention described thus far can be used in its own right for high speed continuous imaging of dynamic phenomena. However, its usefulness can be enhanced by applying it in conjunction with other aspects of the image acquisition method and apparatus of the present invention. Most notably, one would like to be able to control certain imaging parameters such as the obliqueness of the slice being imaged. This can be done by imaging in near realtime with the present invention and concurrently allowing interactive control of certain aspects of the NMR pulse sequence.

Figure 5:
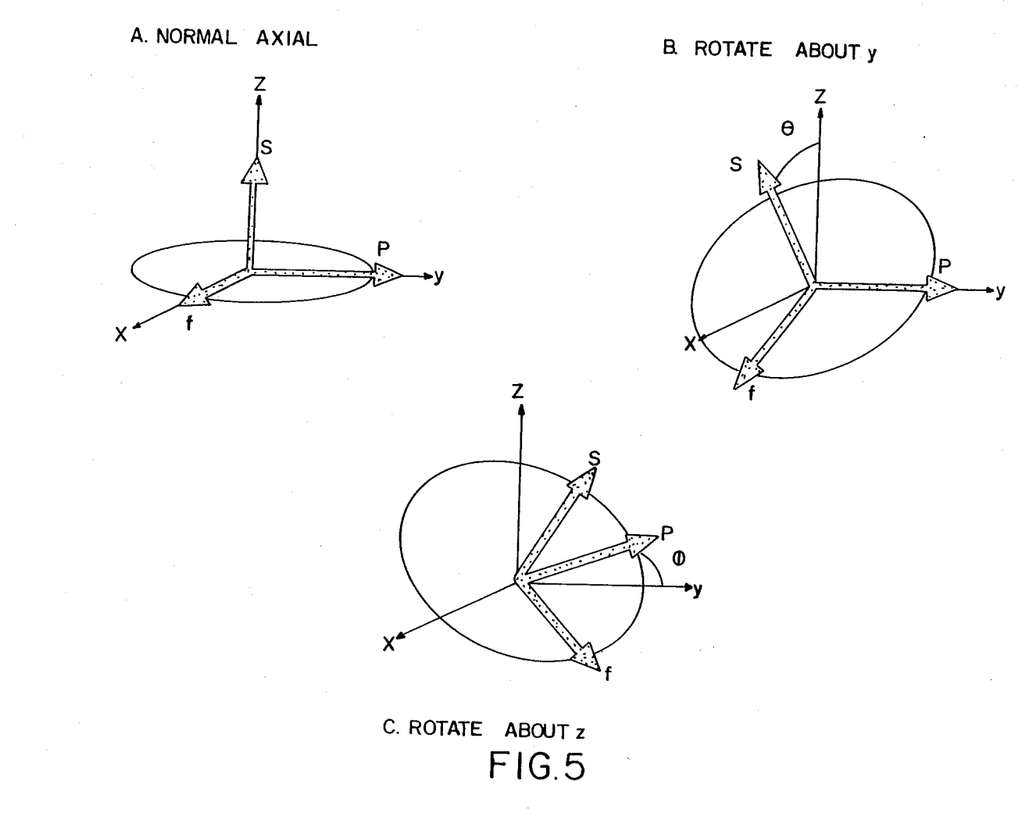
FIG. 5 is an illustration indicating a method for creating angulated or oblique slices.

This process is illustrated in FIG. 5 which shows one method for generating oblique slices. This is performed via application of signals to magnetic gradients. In conventional imaging three distinct gradient waveforms are used: slice selection (S), phase encoding (P), and frequency encoding (F). Each has a particular time-varying shape. Additionally, in a conventional system gradients can be applied along the three directions x, y, and z. The specific slice orientation imaged is dictated by which gradient waveform is applied to which direction. For example if the S waveform is applied along z, P along y, and F along x, then by convention a transaxial slice is imaged. By applying linear combinations of the S, P, and F waveforms to the x, y, and z directions, a different combination for each, it is possible to image oblique slices. Previously it has been unnecessary to allow alteration of such combinations to occur at high speed because image reconstruction was so slow. However, with the present invention such alteration at relatively high speed is desirable. Accordingly, another novel aspect of the invention is hardware to determine such linear combinations of gradients at high speed. This can now be described with reference to FIGS. 5 and 6.

FIG. 5 illustrates how an oblique slice can be specified via selection of two angles. Starting with an axial slice (FIG. 5A), the S-P-F system is rotated angle $\theta$ away from the z-axis (FIG. 5B). To those skilled in the art, this is recognized as a rotation of angle $\theta$ about the y-axis. Similarly, the system is next rotated and angle $\phi$ away from the y-axis (FIG. 5C). Again, those skilled in the art recognize this as a rotation of angle $\phi$ about the z-axis. Thus angles $\theta$ and $\phi$ specify the oblique slice.

Figure 6:
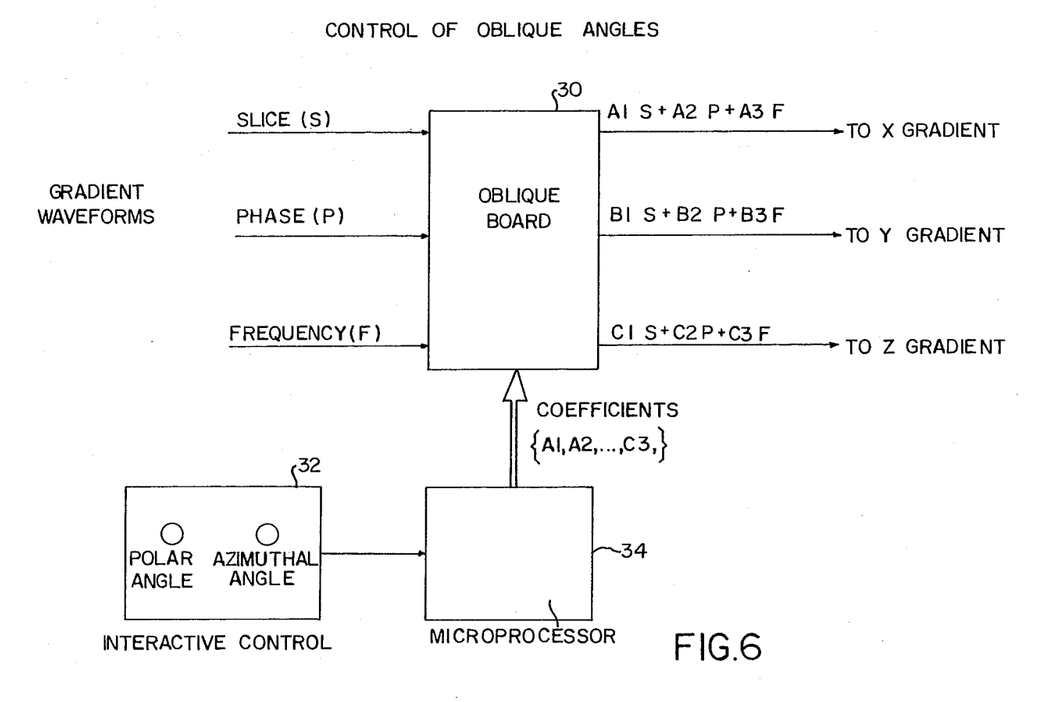
FIG. 6 is a schematic diagram showing circuitry for operator interactive control of slice obliquity according to the present invention.

FIG. 6 illustrates circuitry for allowing interactive control of slice obliquity by an operator of the video processor of the invention. Within the hardware for an NMR system the three gradient waveforms are directed each repetition interval to an Oblique Board 30. This board forms appropriate linear combinations of the S, P, and F waveforms and directs them to the x, y, and z gradient controls. This is standard on many commercial systems and known to those skilled in the art. The combination coefficients A1, A2, ..., C3 are determined by the host computer and downloaded to the Oblique Board.

With applicant's interactive method and apparatus the operator can adjust controls 32 for the polar angle $\theta$ and the azimuthal angle $\phi$ where these have been defined (see FIG. 5). These values are sensed by microprocessor 34 and used to quickly compute the combination coefficients A1, A2, ..., C3. This can be done within several hundred milliseconds. These coefficients are then strobed to the conventional Oblique Board 30 and used to generate new linear combinations of the S, P, and F waveforms. During this entire period the NMR pulse sequence continues to run, with images generated and displayed in near realtime on a television monitor. In this way the operator can adjust the oblique angulation with the $\theta$ and $\phi$ controls and within a fraction of a second see images for the correspondingly adjusted slice as they are generated.

This concept can be further utilized and extended so that other arbitrary aspects of the NMR acquisition are modified at high speed in conjunction with the realtime NMR imaging of the present invention. Examples of other aspects of NMR acquisition which could be modified include gradient waveforms, modulation and amplitude of the RF waveforms, TR (Repetition Time) and TE (Echo Time), and the number of phase encodings used in the sequence.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method of forming near real time computed images of materials within a body based on measurements of NMR characteristics of the body comprising the steps of:
    subjecting a body area to a predetermined plurality of applications of a short repetition time (TR) NMR pulse sequence, wherein each application corresponds to at least one of a corresponding plurality of phase encodings, and collecting data from which an image can be formed;
    constructing an image from said imaging data corresponding to said predetermined plurality of applications of the short repetition time NMR pulse sequence; and
    continuously updating said image by collecting imaging data from repetitive applications of one or more short repetition time NMR pulse sequences applied subsequent to said predetermined plurality of applications of the short repetition time NMR pulse sequence, each of said applications of one or more pulse sequences consisting of less applications than said predetermined plurality of applications of the pulse sequence, and repetitively substituting the imaging data from each of said applications of one or more pulse sequences for corresponding imaging data previously used to construct the image, thereby providing for continuous partial updating of said image.

2. A method according to claim 1 wherein the NMR pulse sequences are applied at intervals of about 8–20 milliseconds.

3. A method according to claim 1 wherein said predetermined plurality of applications of the NMR pulse sequence comprises 16–128 pulses having 16–128 corresponding phase encodings.

4. A method according to claim 1 wherein said application of one or more NMR pulse sequences comprises 1–10 pulses having 1–10 corresponding phase encodings.

5. A method according to claims 2, 3 or 4 wherein the image is updated at intervals of about 10–500 milliseconds.

6. A method according to claim 1 wherein each of said predetermined plurality of applications of a short repetition time NMR pulse sequence corresponds to one of said corresponding plurality of phase encodings.

7. A method according to claim 1 wherein each of said predetermined plurality of applications of a short repetition time NMR pulse sequence corresponds to two or more of said corresponding plurality of phase encodings.

8. A method according to claim 1 including concurrently and interactively adjusting the volume or slice being irradiated, measured, and imaged by altering selectable gradient parameters.

9. A method according to claim 8 wherein said selectable gradient parameters comprise slice selection, phase encoding and frequency encoding.

10. A method according to claim 9 wherein the adjustments which may be made to the image include angulation of an image slice.

11. A method according to claim 1 including concurrently and interactively adjusting image features by altering the radiofrequency modulation and amplitude, the repetition time (TR), and the echo time (TE) either individually or in any desired combination thereof.

12. A method of forming near real time computed images of materials within a body based on measurements of NMR characteristics of the body comprising the steps of:
    subjecting a body area to a predetermined plurality of applications of a short repetition time (TR) NMR pulse sequence, wherein each application corresponds to one of a corresponding plurality of phase encodings, and collecting data from which an image can be formed;
    constructing an image from said imaging data corresponding to said predetermined plurality of applications of the short repetition time NMR pulse sequence;
    continuously updating said image by collecting imaging data from repetitive applications of one or more short repetition time NMR pulse sequences applied subsequent to said predetermined plurality of applications of the short repetition time NMR pulse sequence, each of said applications of one or more pulse sequences consisting of less applications than said predetermined plurality of applications of the pulse sequence, and repetitively substituting the imaging data from each of said applications of one or more pulse sequences for corresponding imaging data previously used to construct the image, thereby providing for continuous partial updating of said image; and
    concurrently and interactively adjusting the image being constructed by altering selectable gradient parameters.

13. A method according to claim 12 wherein the NMR pulse sequences are applied at intervals of about 10-16 milliseconds.

14. A method according to claim 12 wherein said predetermined plurality of applications of the NMR pulse sequence comprises 16-128 pulses having 16-128 corresponding phase encodings.

15. A method according to claim 12 wherein said application of one or more NMR pulse sequences comprises 1-10 pulses having 1-10 corresponding phase encodings.

16. A method according to claim 13, 14 or 15 wherein the image is updated at intervals of about 10-500 milliseconds.

17. A method according to claim 12 wherein said selectable gradient parameters comprise slice selection, phase encoding and frequency encoding.

18. A method according to claim 17 wherein the adjustments which may be made to the image include angulation.

19. A method according to claim 12 including concurrently and interactively adjusting image features by altering the radiofrequency modulation and amplitude, the repetition time (T)), and the echo time (TE) either individually or in any desired combination thereof.

20. A high speed NMR imaging apparatus for constructing and displaying near real time images of a body portion of interest and which are derived from NMR measurements, said apparatus comprising:
means for performing NMR measurements on a body using a predetermined pulse sequence that generates signals;
means for subjecting said signals derived from said pulse sequences to a Fast Fourier Transform;
buffer memory means for storing said signals with the most recently acquired signals at the top of the memory;
means for repetitively providing a video synchronization pulse at predetermined intervals;
means for reading a predetermined one or more of the most recently acquired signals from said buffer memory means upon prompting by said video synchronization pulse, and forming for each a difference signal by subtracting therefrom the previous one or more signals corresponding thereto, said previous signals also having been stored in said buffer memory means;
means for forming an image contribution for each of said difference signals by multiplication of each of said difference signals by a complex exponential function of appropriate frequency;
image storage memory means for containing an existing total current image;
means for adding said image contributions to said existing total current image contained in said image storage memory means; and
means associated with said image storage memory means for forming and displaying a continuously updated image of the body portion of interest.

21. A high speed NMR imaging apparatus according to claim 20 wherein the time interval of each pulse sequence is about 10 milliseconds, the time interval of the Fourier Transformation of data from each pulse sequence is about 5 milliseconds, and the time interval between each video synchronization pulse is about 33 milliseconds.

22. A high speed NMR imaging apparatus according to claim 21 wherein said image of the body portion is updated about every 1/30 second.

23. A high speed NMR imaging apparatus according to claim 20 comprising a reading means and a corresponding image forming means for each of said recently acquired signals.

24. A high speed NMR imaging apparatus according to claim 20 including means for interactive control of the image being constructed and displayed in order to obtain a desired oblique angulation of the image, said interactive control means comprising control means for selectively adjusting pulse sequence gradient parameters including slice selection, phase encoding, and frequency encoding, and computer means electrically connected to said control means for computing adjustments to be made to said gradient parameters to effect the desired change in oblique angulation of the image being formed and displayed.

25. A high speed NMR imaging apparatus for constructing and displaying near real time images of a body portion of interest and which are derived from NMR measurements, said apparatus comprising:
means for performing NMR measurements on a body using a predetermined pulse sequence that generates signals;
means for subjecting said signals derived from said pulse sequences to a Fast Fourier Transform;
buffer memory means for storing said signals with the most recently acquired signals at the top of the memory;
means for repetitively providing a video synchronization pulse at predetermined intervals;
means for reading a predetermined one or more of the most recently acquired signals form said buffer memory means upon prompting by said video synchronization pulse, and forming for each a difference signal by subtracting therefrom the previous one or more signals corresponding thereto, said previous signals also having been stored in said buffer memory means;
means for forming an image contribution for each of said difference signals by multiplication of each of said difference signals by a complex exponential function of appropriate frequency;
image storage memory means for containing an existing total current image;
means for adding said image contributions to said existing total current image contained in said image storage memory means;
means associated with said image storage memory means for forming and displaying a continuously updated image of the body portion of interest; and
means for interactive control of the image being formed and displayed in order to obtain a desired oblique angulation of the image, said interactive control means comprising control means for selectively adjusting pulse sequence gradient parameters including slice selection, phase encoding and frequency encoding, and computer means electrically connected to said control means for computing adjustments to be made to said gradient parameters to effect the desired change in oblique angulation of the image being formed and displayed.

26. A high speed NMR imaging apparatus according to claim 25 wherein said continuously updated image is formed and displayed concurrently with adjustment of said control means and the oblique angulation of the image is substantially instantaneously changed to a new oblique angulation corresponding to the adjustment of said control means.

* * * * *

UNITED STATES PATENT AND TRADEMARK OFFICE
CERTIFICATE OF CORRECTION

PATENT NO. : 4,830,012
DATED : 5/16/89
INVENTOR(S) : Stephen J. Riederer

It is certified that error appears in the above-indentified patent and that said Letters Patent is hereby corrected as shown below:

At Column 1, line 3, after the title and before "Technical Field" please insert:

--GOVERNMENT INTEREST

This invention was made with Government support under Grant No. 1 R01 CA3/993-01 awarded by the National Institutes of Health. The Government has certain rights in the invention.--

Signed and Sealed this

Fifteenth Day of October, 1996

Attest:

BRUCE LEHMAN

Attesting Officer     Commissioner of Patents and Trademarks